(12) United States Patent
Lim et al.

(10) Patent No.: US 8,637,775 B2
(45) Date of Patent: Jan. 28, 2014

(54) PRINTED CIRCUIT BOARD AND METHOD OF MANUFACTURING THE SAME

(75) Inventors: Kyoung Hwan Lim, Gyeongsangnam-do (KR); Won Hyung Park, Busan (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 289 days.

(21) Appl. No.: 13/007,550

(22) Filed: Jan. 14, 2011

(65) Prior Publication Data
US 2011/0247858 A1   Oct. 13, 2011

(30) Foreign Application Priority Data
Apr. 7, 2010   (KR) .......................... 10-2010-0031995

(51) Int. Cl.
*H05K 1/00* (2006.01)

(52) U.S. Cl.
USPC ............ 174/250; 174/255; 174/257; 174/258

(58) Field of Classification Search
CPC .................................. H05K 3/28; H05K 3/06
USPC ........................ 174/250, 251, 255, 257, 258
See application file for complete search history.

(56) References Cited

U.S. PATENT DOCUMENTS

| | | | | |
|---|---|---|---|---|
| 5,032,694 A | * | 7/1991 | Ishihara et al. | 174/256 |
| 5,270,493 A | * | 12/1993 | Inoue et al. | 174/253 |
| 6,847,114 B2 | * | 1/2005 | Sett et al. | 257/717 |
| 2005/0088833 A1 | * | 4/2005 | Kikuchi et al. | 361/763 |
| 2009/0200069 A1 | * | 8/2009 | Kariya et al. | 174/255 |

FOREIGN PATENT DOCUMENTS

JP   05-267829   10/1993

OTHER PUBLICATIONS

Office Action from counterpart Japanese Patent Application No. 2011-001134, mailed Jun. 26, 2012, 6 pages including English summary.

* cited by examiner

*Primary Examiner* — Hoa C Nguyen
(74) *Attorney, Agent, or Firm* — Bracewell & Giuliani LLP

(57) ABSTRACT

Disclosed herein is a printed circuit board, including: a substrate; a first circuit layer formed on the substrate; a first insulation layer formed on the first circuit layer and having a pattern corresponding to that of the first circuit layer; and a second insulation layer formed on the substrate such that the second insulation layer surrounds the first circuit layer and the first insulation layer formed on the first circuit layer. The printed circuit board is advantageous in that process time and process cost can be reduced because a first insulation layer is used as an etching resist and is included as a part of a printed circuit board even after etching.

2 Claims, 5 Drawing Sheets

PRINTED CIRCUIT BOARD AND METHOD OF MANUFACTURING THE SAME

CROSS REFERENCE TO RELATED APPLICATION

This application claims the benefit of Korean Patent Application No. 10-2010-0031995, filed Apr. 7, 2010, entitled "A printed circuit board and a method of manufacturing the same", which is hereby incorporated by reference in its entirety into this application.

BACKGROUND OF THE INVENTION

1. Technical Field

The present invention relates to a printed circuit board and a method of manufacturing the same.

2. Description of the Related Art

Generally, printed circuit boards (PCBs) are manufactured by patterning one or both sides of a substrate, composed of various thermosetting resins, using copper foil, and disposing and fixing ICs or electronic parts on the substrate to form an electric circuit and then coating the substrate with an insulator.

Recently, electronic products have been rapidly multi-functionalized and operated at high speed. In order to keep up with this trend, semiconductor chips, and semiconductor-embedded printed circuit boards in which semiconductor chips are connected with a main substrate have made rapid progress, too.

Therefore, printed circuit boards are required to be highly-densified and be operated at high speed. In order to meet this requirement, printed circuit boards must be light, thin, short and small, be provided with microcircuits, have excellent electrical properties, have high reliability and have a high-speed signal transmission structure.

Meanwhile, as printed circuit boards are used in various fields because of the progress of electronic products, efforts to simplify a process of manufacturing a printed circuit board and reduce the production cost of a printed circuit board are being made.

FIG. 1 is a flowchart showing a conventional method of manufacturing a printed circuit board, and FIGS. 2 to 8 are sectional views showing a conventional method of manufacturing a printed circuit board. Hereinafter, the conventional method of manufacturing a printed circuit board 10 will be described with reference to FIGS. 1 to 8.

First, as shown in FIGS. 1 and 2, a substrate 11 including a first metal layer 12 formed thereon is provided, and then reference holes are formed in the substrate 11 (S10). Then, pretreatment, such as washing, roughening or the like, is conducted.

Subsequently, as shown in FIGS. 1 and 3, a dry film 13 is formed on the pretreated first metal layer 12 (S30).

Subsequently, as shown in FIGS. 1 and 4, the dry film 13 is exposed (S40), and is then developed (S50).

Subsequently, as shown in FIGS. 1 and 5, the first metal layer 12 is etched to form a first circuit layer 14 (S60).

Subsequently, as shown in FIGS. 1 and 6, the dry film 13 is removed (S70). In this case, whether or not the first circuit layer 14 operates normally may be checked.

Subsequently, as shown in FIGS. 1 and 7, the exposed first circuit layer 14 is black-oxidized. (S80).

Subsequently, as shown in FIGS. 1 and 8, the black-oxidized first circuit layer 14 is laminated with an insulation layer 15, and then a second metal layer 16 for forming an additional circuit layer is formed on the insulation layer 15 (S90).

However, the conventional method of manufacturing the printed circuit board 10 is problematic in that process time and cost are increased because its processes, such as exposing, developing, removing, laminating and the like, are complicated.

SUMMARY OF THE INVENTION

Accordingly, the present invention has been devised to solve the above-mentioned problems, and the present invention provides a method of manufacturing a printed circuit board, in which the total number of processes is decreased by omitting the processes of laminating, exposing, developing and removing, thus reducing process time and process cost, and a printed circuit board manufactured by the method.

An aspect of the present invention provides a printed circuit board, including: a substrate; a first circuit layer formed on the substrate; a first insulation layer formed on the first circuit layer and having a pattern corresponding to that of the first circuit layer; and a second insulation layer formed on the substrate such that the second insulation layer surrounds the first circuit layer and the first insulation layer formed on the first circuit layer.

Here, the first insulation layer and the second insulation layer may be made of materials different from each other.

Another aspect of the present invention provides a method of manufacturing a printed circuit board, including: providing a substrate including a first metal layer formed thereon; forming a patterned first insulation layer on the first metal layer; patterning the first metal layer to allow the first metal layer to have a pattern corresponding to that of the first insulation layer, thus forming a first circuit layer; and forming a second insulation layer on the substrate such that the second insulation layer surrounds the first circuit layer and the first insulation layer formed on the first circuit layer.

Here, the method may further include, after the providing of the substrate including the first metal layer formed thereon, black-oxidizing the first metal layer.

Further, the forming of the patterned first insulation layer may include: printing the patterned first insulation layer on the first metal layer; and curing the first insulation layer.

Further, in the forming of the first circuit layer, the first circuit layer having a pattern corresponding to that of the first insulation layer may be formed by etching the first metal layer using the first insulation layer as an etching resist.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
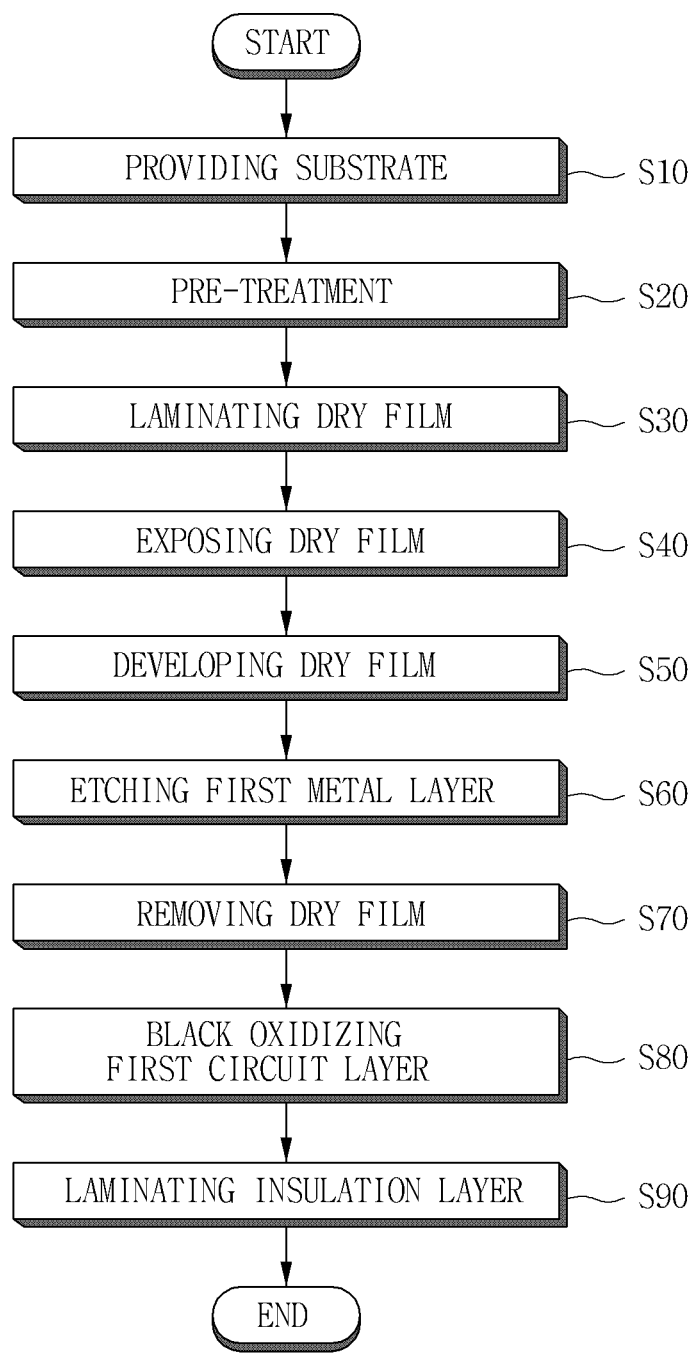
FIG. 1 is a flowchart showing a conventional method of manufacturing a printed circuit board.
Figure 2:
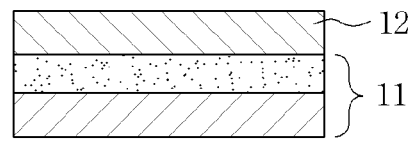
FIGS. 2 to 8 are sectional views showing a conventional method of manufacturing a printed circuit board.
Figure 3:
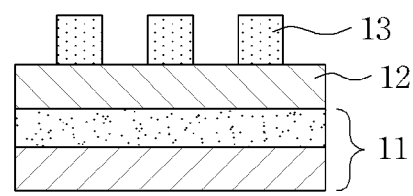
Figure 4:
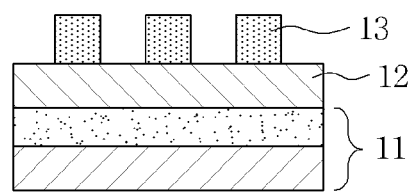
Figure 5:
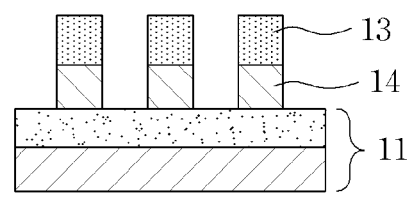
Figure 6:
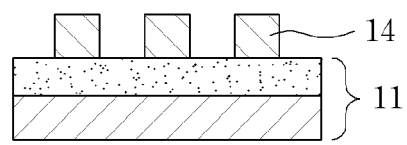
Figure 7:
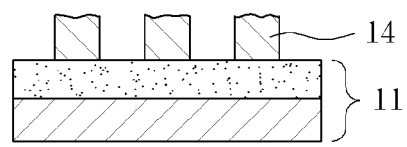
Figure 8:
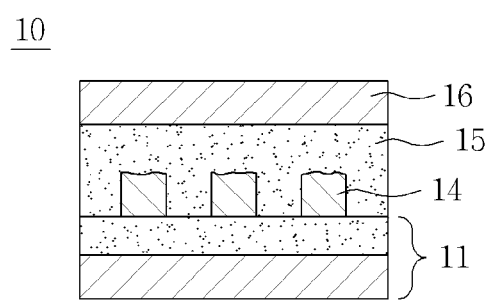

The objects, features and advantages of the present invention will be more clearly understood from the following detailed description and preferred embodiments taken in conjunction with the accompanying drawings. Throughout the accompanying drawings, the same reference numerals are used to designate the same or similar components, and redundant descriptions thereof are omitted. Further, in the following description, the terms "first," "second" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Structure of a Printed Circuit Board

Figure 9:
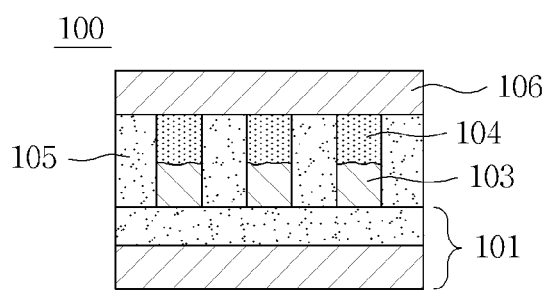
FIG. 9 is a sectional view showing a printed circuit board according to an embodiment of the present invention.

FIG. 9 is a sectional view showing a printed circuit board according to an embodiment of the present invention. Hereinafter, a printed circuit board 100 according to this embodiment will be described with reference to FIG. 9. In this embodiment, a single-layered printed circuit layer is described as the printed circuit board 100, but the present invention is not limited thereto. The present invention may include a multi-layered printed circuit board.

As shown in FIG. 9, the printed circuit board 100 according to this embodiment includes a substrate 101, a first circuit layer 103, a first insulation layer 104, and a second insulation layer 105. Here, the first circuit layer 103 and the first insulation layer 104 are configured such that they have patterns corresponding to each other.

The substrate 101 is a base of the printed circuit board 100. It is shown in FIG. 9 that the substrate 101 has a single layer structure including a metal layer and an insulation layer. However, the present invention is not limited thereto, and the substrate 101 may have a multi-layer structure.

The first circuit layer 103 is formed on the substrate 101, and serves to transfer electrical signals.

Here, the first circuit layer 103 may have a predetermined pattern, and may be made of a conductive metal, such as gold (Au), silver (Ag), copper (Cu), nickel (Ni) or the like.

The first insulation layer 104 is formed on the first circuit layer 103, and has a pattern corresponding to that of the first circuit layer 103.

Here, the first insulation layer 104 is formed only on the first circuit layer 103, and the second insulation layer is formed on the substrate 101 on which the first circuit layer 103 is not formed. The first insulation layer 104 may be made of a composite polymer resin which is generally used as an interlayer insulation material. For example, the first insulation layer 104 may be made of an epoxy resin, such as prepreg, ajinomoto build up film (ABF), FR-4, bismaleimide triazine (BT) or the like.

The second insulation layer 105 is formed on the substrate 101.

Here, the second insulation layer 105 may be formed on the first insulation layer 104 as well as on the substrate 101 on which the first circuit layer 103 is not formed. Further, the second insulation layer 105, like the first insulation layer 104, may be made of an epoxy resin, such as prepreg, ajinomoto build up film (ABF), FR-4, bismaleimide triazine (BT) or the like. Meanwhile, the second insulation layer 105 may made of a material different from the material constituting the first insulation layer 104, but the material constituting the second insulation layer 105 must bond easily with the material constituting the first insulation layer 104.

Meanwhile, the printed circuit board 100 may further include a second metal layer 106 on the second insulation layer 105, and the second metal layer 106 may be patterned to form a circuit layer.

Method of Manufacturing a Printed Circuit Board

Figure 10:
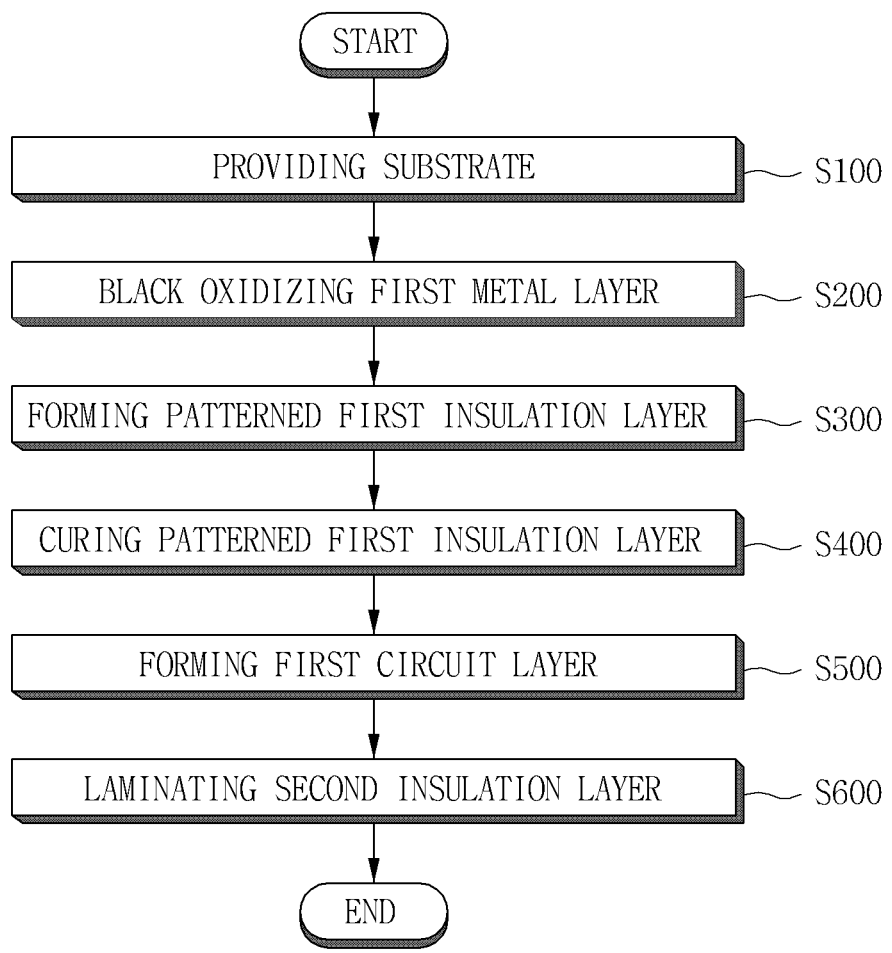
FIG. 10 is a flowchart showing a method of manufacturing the printed circuit board shown in FIG. 9.

FIG. 10 is a flowchart showing a method of manufacturing the printed circuit board shown in FIG. 9, and FIGS. 11 to 15 are sectional views showing a method of manufacturing the printed circuit board shown in FIG. 9. Hereinafter, a method of manufacturing a printed circuit board 100 according to this embodiment will be described with reference to FIGS. 10 to 15.

Figure 11:
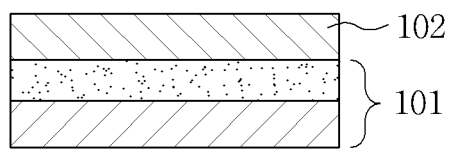
FIGS. 11 to 15 are sectional views showing a method of manufacturing the printed circuit board shown in FIG. 9.

First, as shown in FIGS. 10 and 11, a substrate 101 including a first metal layer 102 formed thereon is provided (S100).

In this case, an insulation layer including a metal layer formed on at least one side thereof, for example, a copper clad laminate (CCL) may be used as the substrate 101. Further, the substrate 101 may be provided with reference holes for fitting it with other constituents.

Meanwhile, the first metal layer 102 is converted into a first circuit layer 103 later, and may be made of a conductive metal.

Figure 12:
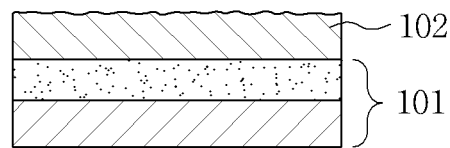

Subsequently, as shown in FIGS. 10 and 12, the surface of the first metal layer 102 is black-oxidized (S200).

Here, the black-oxidizing process is a process for roughening the surface of the first metal layer 102 in order to improve the adhesion between the first metal layer 102 and a first insulation layer 104 or a second insulation layer 105 and increase the heat resistance of the first metal layer 102. For example, when the first metal layer 102 is made of copper (Cu), the black-oxidizing process may be conducted by precipitating $Cu_2O$ (brown) or CuO (black) on the surface of the first metal layer 102.

Figure 13:
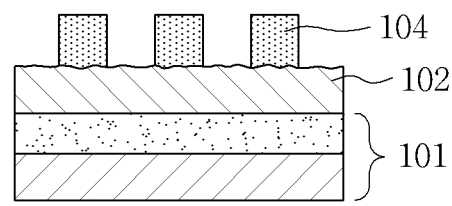

Subsequently, as shown in FIGS. 10 and 13, a first insulation layer 104 is formed on the first metal layer 102 (S300, S400).

In this case, the first insulation layer 104 may be formed on the first metal layer 102 by a printing method (S300). Concretely, the first insulation layer 104 may be formed on the first metal layer 102 by providing a screen for printing, applying the first insulation layer on the screen and then pressing the first metal layer 102 using a squeegee. In this case, the first insulation layer 104 has a pattern corresponding to the pattern to be formed on the first metal layer 102.

Then, the first insulation layer 104 formed on the first metal layer 102 may be cured (S400). In this case, the first insulation layer 104 may be cured by applying heat and pressure thereto.

Figure 14:
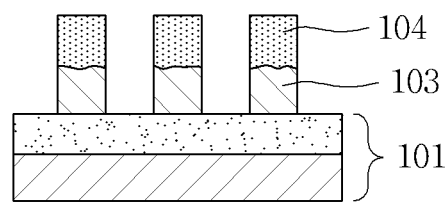

Subsequently, as shown in FIGS. 10 and 14, the first metal layer 102 is patterned to form a first circuit layer 103 (S500).

The patterning of the first circuit layer 103 may be conducted by etching, and, in this case, the first insulation layer 104 serves as an etching resist. That is, when an etchant is applied on the first metal layer 102 formed thereon with the first insulation layer 103, only the portion on which the first insulation layer 104 is not formed is etched, whereas the portion on which the first insulation layer is formed is not etched, thus forming the first circuit layer 103 having a pattern corresponding to the pattern of the first insulation layer 104. Therefore, it is preferred that the first insulation layer 104 be made of a material which cannot be removed by the etchant for etching the first metal layer 102. However, the first insulation layer 104, unlike a general etching resist, is not removed even after the etching process is completed, and is included as a part of the printed circuit board 100.

Meanwhile, after the first circuit layer 103 is formed, whether or not the first circuit layer 103 operates normally may be checked.

Figure 15:
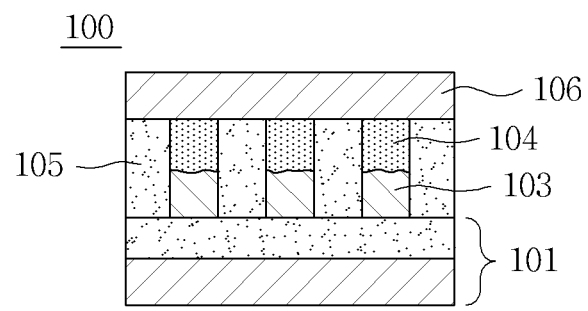

Subsequently, as shown in FIGS. 10 and 15, a second insulation layer 105 is formed on the substrate 101 such that the second insulation layer surrounds the first circuit layer and the first insulation layer formed on the first circuit layer (S600).

In this case, it is shown in FIG. 15 that the top surface of the second insulation layer 105 is flush with the top surface of the first insulation layer 104. However, the second insulation layer 105 shown in FIG. 15 is an illustrative example, and the second insulation layer 105 may be formed on the first insulation layer 104 as well as on the substrate 101 on which the first circuit layer 103 and the first insulation layer are not formed. Further, the second insulation layer 105 may be made of a material which bonds easily with the first insulation layer 104.

Meanwhile, the printed circuit board 100 may further include a second metal layer 106 on the second insulation layer 105, and the second metal layer 106 may be patterned to form a circuit layer.

Through the above processes, the printed circuit board 100 shown in FIG. 15 according to an embodiment of the present invention is manufactured.

As described above, according to the present invention, process time and process cost can be reduced because a first insulation layer is used as an etching resist and is included as a part of a printed circuit board even after etching.

Further, according to the present invention, two processes including a pre-treating process before laminating a dry film and a black-oxidizing process before laminating an insulation layer are unified into a black-oxidizing process before forming a first insulation layer, thus reducing the manufacturing time and cost of a printed circuit board.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications, additions and substitutions of the present invention belong to the scope of the present invention, and the specific scope of the present invention will be clearly defined by the appended claims.

What is claimed is:

1. A printed circuit board, comprising:
   a substrate;
   a first circuit layer formed on the substrate;
   a first insulation layer formed on the first circuit layer only and having a pattern corresponding to that of the first circuit layer;
   a second insulation layer formed on the substrate such that the second insulation layer surrounds the first circuit layer and the first insulation layer formed on the first circuit layer, wherein the second insulation layer is in contact with both the first circuit layer and the first insulation layer; and
   a metal layer formed on the second insulation layer to form a second circuit layer,
   wherein the first circuit layer and the metal layer are separated by the first insulation layer.

2. The printed circuit board according to claim 1, wherein the first insulation layer and the second insulation layer are made of materials different from each other.

* * * * *